(12) United States Patent
Zuppero et al.

(10) Patent No.: US 6,678,305 B1
(45) Date of Patent: Jan. 13, 2004

(54) SURFACE CATALYST INFRA RED LASER

(75) Inventors: Anthony C. Zuppero, Pollock Pines, CA (US); Jawahar M. Gidwani, San Francisco, CA (US)

(73) Assignee: NoeKismet, L.L.C., San Francisco, CA (US)

( * ) Notice: Subject to any disclaimer, the term of this patent is extended or adjusted under 35 U.S.C. 154(b) by 92 days.

(21) Appl. No.: 09/691,948

(22) Filed: Oct. 19, 2000

Related U.S. Application Data (60) Continuation-in-part of application No. 09/589,669, filed on Jun. 7, 2000, now Pat. No. 6,327,859, which is a division of application No. 09/304,979, filed on May 4, 1999, now Pat. No. 6,114,620.
(60) Provisional application No. 60/160,527, filed on Oct. 20, 1999.

(51) Int. Cl.[7] .................................................. H01S 3/095
(52) U.S. Cl. ............................. 372/89; 372/60; 372/90; 372/55
(58) Field of Search ............................ 372/55, 89, 90, 372/60; 423/219

(56) References Cited

U.S. PATENT DOCUMENTS

| | | |
|---|---|---|
| 3,694,770 A | 9/1972 | Burwell et al. |
| 5,587,827 A * | 12/1996 | Hakimi et al. ............... 359/249 |
| 6,114,620 A | 9/2000 | Zuppero et al. |

FOREIGN PATENT DOCUMENTS

| | | |
|---|---|---|
| DE | 1230509 | 12/1966 |
| NL | 1065463 | 4/1967 |
| WO | WO 00/72384 A1 | 11/2000 |
| WO | WO 01/28677 A1 | 4/2001 |

OTHER PUBLICATIONS

G.H. Takaoka et al., "Preparation and catalytic activity of nano–scale Au islands supported on TiO2", Nuclear Instruments & Methods in Physics Research, Section–B: Beam Interactions with Materials and Atoms, North–Holland Publishing Company, Amsterdam, NL, vol. 121, No. 1, 1997, pp. 503–506, XP004057973, abstract.

P. Avouris et al., "Electron–Stimulated Catalysis Device", IBM Technical Disclosure Bulletin, vol. 25, No. 12, May 1, 1983, pp. 6378–6379, New York, US, XP002219954.

Tripa, C. E. et al., "Kinetics measurements of CO photo–oxidation on Pt(111)," J. Chem. Phys., vol. 105, No. 4, Jul. 22, 1996, pp. 1691–1696, especially the disclosure beneath the paragraph header "C. Cross section determination methods" on p. 1693.

(List continued on next page.)

*Primary Examiner*—Jerome Jackson
*Assistant Examiner*—Matthew C Landau
(74) *Attorney, Agent, or Firm*—Baker & McKenzie (57) ABSTRACT

An energy converter reacts hydrocarbons and air on a catalyst configuration to produce a population inversion. A photovoltaic system may extract the radiating energy, and a laser system may extract a significant fraction of the reaction energy in the form of coherent radiation. The flooding of the catalyst adsorption sites with fuel and the choice of catalyst predisposes the adsorbing oxygen molecules to create monoatomic oxygen hot-atoms, which deposit the considerable energy of oxygen adsorption directly into a reaction channel of adjacent, adsorbed and simple fuel radicals, thereby producing simple, energetic product molecules, concentrating the energy in one or a few modes, and strongly favoring inverted populations. A solid state method to stimulate precursor chemisorbed specie dissociation accelerates the reaction rates, providing a method to greatly intensify pulsed power output, increase efficiency, and to facilitate nano-scale and micro-scale thermal energy heat rejection processes.

25 Claims, 2 Drawing Sheets

OTHER PUBLICATIONS

Nolan, P. D. et al., "Molecularly chemisorbed intermediates to oxygen adsorption on Pt(111): A molecular beam and electron energy–loss spectroscopy study," J. Chem. Phys., vol. 111, No. 8, Aug. 22, 1999, pp. 3696–3707, especially figure 9 and the descrition of figure 9 set forth on p. 3702, 2nd full paragraph et seq.

Ree, J. et al., "Reaction of atomic oxygen with adsorbed carbon monoxide on a platinum surface," J. Chem. Phys., vol. 104, No. 2, Jan. 8, 1996, pp. 742–757, particularly the abstract and p. 753.

Ree, J. et al., "Dynamics of Gas–Surface Interactions: Reaction of Atomic Oxygen with Chemisorbed Hydrogen on Tungsten," Journal of Physical Chemistry, vol. 101 (#25), pp. 4523–4534, Jun. 19, 1997.

Ree, J. et al., "Reaction of atomic oxygen with adsorbed carbon monoxide on a platinum surface," Journal of Chemical Physics, vol. 104, Issue 2, pp. 742–757, Jan. 8, 1996.

Nolan, P.D. et al., "Molecularly chemisorbed intermediates to oxygen adsorption on Pt(III): A molecular beam and electron energy–loss spectroscopy study," Journal of Chemical Physics, vol. III, No. 8, pp. 3696–3704, Aug. 22, 1999.

Nolan, P. D. et al., "Translation Energy Selection of Molecular Precursors to Oxygen Adsorption on Pt (III)," Physical Review Letters, vol. 81, No. 15, pp. 3179–3182, Oct. 12, 1998.

Murphy, M. J. et al., "Inverted vibrational distributions from N2 recombination at Ru (001): Evidence for a metastable molecular chemisorption well," Journal of Chemical Physics, vol. 110, No. 14, pp. 6954–6962, Apr. 8, 1999.

Kim, M. S. et al., "Reaction of Gas–Phase Atomic Hydrogen with Chemisorbed Hydrogen Atoms on an Iron Surface," Bull. Korean Chem. Soc., vol. 18, No. 9, pp. 985–994, May 22, 1997.

Bonn, M. et al., "Phonon–Versus Electron–Mediated Desorption and Oxidation of CO on Ru(0001)," Science, vol. 285, pp. 1042–1045, Aug. 13, 1999. www.sciencemag.org.

Nolan, P. D. et al., "Direct verification of a high–translational–energy molecular precursor to oxygen dissociation on Pd(III)," Surface Science Letters, vol. 419, pp. L107–L113, Sep. 24, 1998.

Davis, J. E. et al., "Kinetics and dynamics of the dissociative chemisorption of oxygen on Ir (III)," Journal of Chem. Phys., vol. 107(3), pp. 943–952, Jul. 15, 1997.

Tripa, C. Emil et al., "Surface–aligned reaction of photogenerated oxygen atoms with carbon monoxide targets," Nature, vol. 398, pp. 591–593, Apr. 15, 1999, www.nature.com.

Shin HK, "Vibrationally excited OD Radicals from the Reaction of Oxygen–Atoms with Chemisorbed Deuterium on Tungsten," Journals of Physical Chemistry, vol. 102 (#13), pp. 2372–2380, Mar. 26, 1998.

Tripa, C. Emil et al., "Kinetics measurements of CO photo–oxidation on Pt(III)," Journal of Chemical Physics, vol. 105, Issue 4, pp. 1691–1696, Jul. 22, 1996.

Diesing, D. et al., "Aluminium oxide tunnel junctions: influence of preparation technique, sample geometry and oxide thickness," Thin Solid Films 342 (1999), pp. 282–290, received Feb. 26, 1998; accepted Sep. 11, 1998.

Frese, et al., "Analysis of Current/Voltage Curves at n–Si/$SiO_2$/Pt Electrodes", J. Electrochem. Soc., Dec. 1994, pp. 3375–3382, vol. 141, No. 12, The Electrochemical Society, Inc.

Frese, et al., "Methanol Oxidation at p–Si/Pt Electrodes, Evidence for Hot Role Reactivity", J. Phys. Chem., 1995, pp. 6074–6083, vol. 99, American Chemical Society.

Gadzuk, "Multiple Electron Processes in Hot–Electron Femtochemistry at Surfaces", http://www.cstl.nist.gov/div837/837.03/highlite/gadzuk1999.htm.

Frese, et al., "Hot Electron Reduction at Etched n–Si/Pt Thin Film Electrodes", J. Electrochem. Soc., Sep. 1994, pp. 2402–2409, vol. 103, The Electrochemical Society, Inc.

Gaillard, et al., "Hot Electron Generation in Aqueous Solution at Oxide–Covered Tantalum Electodes, Reduction of Methylpyridinium and Electrogenerated Chemiluminescence of $Ru(bpy)_3^{2+}$", J. Phys. Chem., 1999, pp. 667–674, vol. 103, American Chemical Society.

Sung, et al., "Demonstration of Electrochemical Generation of Solution–Phase Hot Electrons at Oxide–Covered Tantalum Electrodes by Direct Electrogenerated Chemiluminescence", J. Phys. Chem., 1998, pp. 9797–9805, vol. 102, American Chemical Society.

Zhdanov, et al., "Substrate–mediated photoinduced chemical reactions on ultrathin metal films", Surface Science, 1999, pp. L599–L603, vol. 432, Elsevier Science B.V.

\* cited by examiner

SURFACE CATALYST INFRA RED LASER

CROSS-REFERENCE TO RELATED APPLICATIONS

This application claims the benefit of the U.S. Provisional Patent Application No. 60/160,527 filed on Oct. 20, 1999, and is a continuation-in-part of U.S. patent application Ser. No. 09/589,669 filed on Jun. 7, 2000, now U.S. Pat. No. 6,327,859 which is a divisional application of U.S. patent application Ser. No. 09/304,979 filed on May 4, 1999, now U.S. Pat. No. 6,114,620.

TECHNICAL FIELD OF THE INVENTION

The present invention relates generally to solid-state devices for converting or extracting energy from hydrocarbon-oxidizer reactions. More specifically, this invention relates to a significant improvement of the process for the efficient conversion and extraction of energy in the form of optical emissions and of coherent radiation and from reactants such as hydrocarbons, hydrogen or other combustible materials reacting on a catalyst surface with air or other oxidizers.

BACKGROUND OF THE INVENTION

One method to convert chemical reactant energy directly into useful work such as electricity uses electrochemical couples such as batteries and fuel cells. In this method, a substantial fraction of the reactant bond energies may be converted directly into electrical potential. However, the physical chemistry underlying these processes limits the rate of such conversion substantially. The result is a power per mass and power per volume that is orders of magnitude smaller than that of a mechanical engine.

Another method uses gas dynamic processes to convert chemical energy directly into a dynamic state exhibiting a population inversion. The energy is extracted from this system as coherent radiation. However, the reactants and exhausts of this method are usually dangerous and incompatible with human safety considerations. Moreover, these devices cannot be efficiently miniaturized.

Therefore, it is highly desirable to have a simpler method and system for extracting efficiently without having to use harmful products and without producing hazardous byproducts in the process.

A recent research suggests that certain simple, energetic atoms reacting on a catalytic surface produce products exhibiting a population inversion. An inverted population is the prerequisite for stimulated emission of radiation, which is one method to remove the energy from the reaction and to retain its high degree of usefulness.

One problem in the prior state of technology is the process of creating highly energetic species on the catalyst surface, such as hot atoms and mono-atomic oxygen, that 1) retain a significant amount of the chemical energy for reactions, instead of dissipating it as a heat of adsorption, and 2) that will produce an inverted population as a product of the reaction. The issue in the creation of hot atoms, such as mono-atomic oxygen, is that it usually takes more electrical energy to produce the hot atoms than can be extracted from the resulting chemical reactions.

Research has suggested that mono-atomic, energetic specie reacting with simple adsorbed specie may form vibrationally inverted products, and that this inversion may occur in many systems. For example, research has shown that when gas phase oxygen atoms react with deuterium adsorbed on a tungsten surface, OD radicals are formed in the inverted state, with the highest population appearing at vibrational level 6. This represents a substantial fraction of the available reaction energy being concentrated in the inverted state. Shin, HK, "Vibrationally Excited OD Radicals From The Reaction Of Oxygen-Atoms With Chemisorbed Deuterium On Tungsten," Journal Of Physical Chemistry A, v. 102(#13), pp. 2372–2380, Mar. 26, 1998.

Similar research showed that gas phase atomic oxygen reacting with adsorbed hydrogen on the surface produces population inverted, OH radicals within 100 femtoseconds. Ree J, Kim YH, Shin HK, "Dynamics Of Gas-Surface Interactions: Reaction Of Atomic Oxygen With Chemisorbed Hydrogen On Tungsten," Journal Of Physical Chemistry A, V. 101(#25), pp. 4523–4534, Jun. 19, 1997.

It was shown in Kim, M. S. and J. Ree, "Reaction of Gas-Phase Atomic Hydrogen with Chemisorbed Hydrogen Atoms on an Iron Surface," Bulletin of the Korean Chemical Society, Volume 18, Number 9 (1997), COMMUNICATIONS, pp 985–994, that gas phase atomic hydrogen reacts with chemisorbed hydrogen on an iron surface to form population inverted, desorbed diatomic hydrogen molecules.

It is known that when atomic oxygen in the gas phase reacts with carbon monoxide adsorbed on a platinum catalyst surface, the fraction of reactive collisions producing molecules having vibrational energies corresponding to levels $v3=9$ to 13 is found to be very high and exhibits a vibrational population inversion. Ree, J.; Y. H. Kim, and H. K. Shin, "Reaction of atomic oxygen with adsorbed carbon monoxide on a platinum surface," Journal of Chemical Physics, Jan. 8, 1996, Volume 104, Issue 2, pp. 742–757. This would be useful except for the fact that the mono-atomic oxygen atoms for this reaction must be created using inefficient means, namely electric arcs.

Yet another research has shown that mono-atomic oxygen atoms can be created directly on a catalytic surface by irradiation with UV light. The most probable result of such irradiation is the production of mono-atomic oxygen atoms. The next most probable result is desorption. The issue with this approach is the low efficiency of the generation and conversion of UV light into dissociated oxygen atoms. Tripa, C. Emil, Christopher R. Arumaninayagam, John T. Yates, Jr., "Kinetics measurements of CO photo-oxidation on Pt(111)," Journal of Chemical Physics, Jul. 22, 1996, Volume 105, Issue 4, pp. 1691–1696.

A related research has also shown that oxygen molecules preferentially adsorb on the step sites of a catalyst such as platinum, and that photo generated mono-atomic oxygen atoms preferentially react with other radicals or molecules also adsorbed on the step sites. Atomic and molecular species generated by the photolysis of aligned molecules adsorbed on crystalline solids tend to move preferentially in particular directions relative to the crystal surface. For example, photo-generated mono-atomic oxygen reacts preferentially with adsorbed CO to make excited state CO2. The feature here is the efficiency of reaction of the hot atoms with other surface reactants. An issue here is the preferential production of hot atoms. Tripa, C. Emil; John T. Yates Jr, "Surface-aligned reaction of photo generated oxygen atoms with carbon monoxide targets," Nature, Vol 398, pages 591–593 (1999) Apr. 15, 1999.

Another research showed that the UV photons create hot electrons on a catalyst metal surface and which interact strongly with adsorbed oxygen to cause the trapped oxygen atoms to dissociate or desorb. The salient point is that adsorbates trap in metastable states before they dissociate, and that hot electrons can stimulate such states efficiently. Experiments showed that gas phase oxygen molecules adsorb first as a superoxo-like specie (molecule singly charged on surface) and are then trapped in a shallow barrier of order 0.1 eV. Then the molecule may overcome the barrier and become a peroxo-like specie (doubly charged) in a barrier of order 0.5 eV. Finally, the molecule may overcome this barrier and dissociate into hot atoms. The existence of precursor phases is apparently fairly common and observed in various forms of platinum, palladium and iridium catalysts. Nolan, P. D.; B. R. Lutz, P. L. Tanaka, J. E. Davis, and C. B. Mullins, "Molecularly chemisorbed intermediates to oxygen adsorption on Pt (111): A molecular beam and electron energy-loss spectroscopy study," Journal Of Chemical Physics Volume 111, Number 8, Aug. 22, 1999. Nolan P D, Lutz B R, Tanaka P L, Mullins C B, "Direct verification of a high-translational-energy molecular precursor to oxygen dissociation on Pd(111)," Surface Science v. 419(#1) pp. L1071–L113, Dec. 24, 1998. Nolan, P. D.; B. R. Lutz, P. L. Tanaka, J. E. Davis, and C. B. Mullins, "Translational Energy Selection of Molecular Precursors to Oxygen Adsorption on Pt(111)," Physical Review Letters, VOLUME 81, NUMBER 15 Oct. 12, 1998. Davis, J. E.; P. D. Nolan, S. G. Karseboom, and C. B. Mullins, "Kinetics and dynamics of the dissociative chemisorption of oxygen on Ir(111)," J. Chem. Phys. 107 (3), Jul. 15, 1997, pp943, 10 pages.

Inverted products can be formed by associative desorption. Experiments have shown that nitrogen molecules formed upon catalytic decomposition of ammonia (cracking) over Ru may show a vibrational population inversion. The associative reaction begins with the atomic separation of the nitrogen atoms being similar to that of the surface catalyst atoms and just slightly greater than that of the ground state of a product nitrogen molecule. Murphy, M. J.; J. F. Skelly, and A. Hodgson; B. Hammer, "Inverted vibrational distributions from N2 recombination at Ru(001): Evidence for a metastable molecular chemisorption well," Journal of Chemical Physics—Apr. 8, 1999—Volume 110, Issue 14, pp. 6954–6962.

That reaction rates can be stimulated and increased by many orders of magnitude with picosecond duration and timing is illustrated by recent experiments depicted in a technical publication. Bonn, M.; S. Funk, Ch. Hess, D. N. Denzler, C. Stampfl, M. Scheffler, M. Wolf, G. Ertl, "Phonon- Versus Electron-Mediated Desorption and Oxidation of CO on Ru(0001)," Science, Volume 285, Number 5430 Issue of Aug. 13, 1999, pp. 1042–1045.

The stretched molecule represents the initial condition where the atomic separation during the vibrational oscillation starts with the association reaction at the extrema, defining a reaction product in the highest excited state. It is noted "Vibrational" modes also include the vibration of any specie on the surface against that surface.

Simple reactant radicals on the catalyst surface may preferentially form in mechanically simple ways, which often strongly favor a single vibrational mode for the energy to concentrate, again favoring an inverted population.

Furthermore, mono-atomic oxygen atoms supplied externally to the catalytic surface may cause a population inversion in the products of carbon monoxide reaction to carbon dioxide and in the surface catalyzed oxidation of hydrogen.

Heretofore, the oxygen adsorption process wasted approximately half the reaction energy as heat on the catalyst surface. Therefore, a new method to conserve such energy and extract it into useful energy is highly desired.

SUMMARY OF THE INVENTION

The present invention is directed to a method and system for using a catalyst and reactants to create the "simple, energetic atoms" needed for the generation of the inverted population. In one embodiment, the present invention captures the reaction energy based on the principle that some energetic atoms reacting on a catalytic surface produce products exhibiting a population inversion.

This invention creates population inverted reaction products from fuel and oxidizer reactions on a catalyst surface. A laser operating on the inverted population would efficiently extract the energy from the system. One embodiment uses the hot atom produced during dissociative adsorption of oxygen on catalyst surfaces to provide energetic oxygen free radicals on those surfaces and to cause direct and prompt reaction with a fuel specie, also on the catalyst surface, which biases reactions towards formation of population inverted products. Examples of fuel specie include, but are not limited to, hydrogen, a hydroxyl, a carbon monoxide or a hydrocarbon fragment.

Another embodiment of this invention creates a population inversion by biasing the reaction by choice of catalyst species to form product molecules that are stretched at the moment of desorption from the catalyst surface. Another embodiment creates the population inversion by biasing the reactants by choice of catalyst to cause simple reactants with a large fraction of their energy available upon associative desorption. Another embodiment uses a solid-state method to provide hot electrons directly, and without the use of UV light, which in turn stimulates dissociation of the precursor, peroxo-chemisorbed oxidizer, and cause an avalanche of surface reactions.

In one embodiment, the present invention uses a laser to extract the energy from an inverted population, resulting in conversion of a substantial fraction, and in some cases a majority, of the chemical reaction energy into one or several, nearly monochromatic, coherent beams of light. Such a beam retains the high quality of the energy and is most useful because it can be efficiently converted into electricity, for example, by passing a monochromatic beam into a photovoltaic cell with band gap slightly smaller than the beam photon energy, and equally efficiently into mechanical forces through other means.

BRIEF DESCRIPTION OF THE DRAWINGS

Preferred embodiments of the present invention will now be described, by way of example only, with reference to the accompanying drawings in which.

DETAILED DESCRIPTION OF THE PREFERRED EMBODIMENT OF THE INVENTION

The present invention is directed to biasing the reactions occurring on the surface of a catalyst toward those that deliver a substantial fraction of the energy into product species that exhibit, as a result of the methods of this invention, a population inversion.

Stretched molecules associated with adsorbtion and desorbtion have closely related, reversible effects, both related to population inversion. A method of the present invention in one embodiment uses the hot atoms created upon dissociative chemisorption reacting with a fuel-rich catalyst surface; in another embodiment, a method in the present invention uses stretched molecules produced during associative desorbtion from a catalyst surface; in yet another embodiment, the method of the present invention uses excited state simple products either desorbing from catalyst surfaces or vibrating on those surfaces for a usefully long time; all methods being capable of producing reaction products with population inversions.

According to one embodiment of this invention a catalyst surface is flooded with fuel, such as ethanol, methanol, alchohols or gaseous products of a hydrocarbon reformer. The products of hydrocarbon reformer may include, but are not limited to, CO and H2. A catalyst is chosen such that all or nearly all the reactants adsorb on the catalyst surface. Many catalysts satisfy these criteria, especially the platinum group catalysts. The fuels chemisorb and dissociate into simple radicals on the catalyst surface, such as a platinum catalyst. Under favorable conditions, such as when the catalyst surface is cooled or when the mixture is fuel-rich, the adsorbed fuel molecules will occupy most of the surface sites and leave relatively few sites for oxygen adsorption. The oxygen, upon adsorption under these conditions, dissociates via a process where it is observed that nearly the entire dissociation energy is shared equally between two, monoatomic oxygen atoms, or free radicals, each moving away from the dissociation site with approximately 1 electron volt ("eV") of energy, that is, with nearly all the chemisorption dissociation energy. These free radicals with 1 eV of kinetic energy are referred to as "hot atoms."

In the present invention, such hot atoms almost exclusively find adsorbed fuel radicals as the first, nearest and next nearest collision partners, because the catalyst surface is flooded with fuel. Accordingly, the hot atom free radical places non-thermal energy directly into the chemical reaction coordinate and promptly reacts with the collision partner, as a result of having approximately 1 eV of energy, which is approximately twice the measured activation energy (typically 0.5 eV) needed to initiate the reaction, and forms reaction products that are by necessity born in their highest excited vibrational state.

According to the present invention, a hot atom formed from the dissociation process is made to react before it can reach equilibrium on the catalyst surface and thereby does not dissipate the energy as heat to the substrate or catalyst lattice but instead makes nearly all of the energy of adsorption available for population inversion.

In one embodiment of the present invention, the use of a surface with approximately a monolayer or greater coverage of fuel reactant also reduces the adsorption energy of the oxygen adsorbed species, which adsorption heat would otherwise become unavailable to reaction products.

The present invention is also directed to extracting the energy from the multiple quantum levels associated with the vibrational energy of newly formed product species, whether or not the specie remains adsorbed on the surface of the catalyst. The multiple quantum transitions are all dipole active for specie on a surface.

In one embodiment of the present invention, an optical system, for example, a laser, causes stimulated emission of radiation to occur between the highly populated, higher vibrational quantum number energy levels and the sparsely populated, lower quantum number levels, and thereby removes a substantial fraction of the energy in the form of coherent radiation.

In one embodiment, a photovoltaic device may transform the radiation emitted due to the population inversion directly into electricity, with or without the use of lasers.

The laser may use overtone transitions between levels, resulting in multiples, e.g., double, triple or higher, of the transition frequencies usually associated with single level transitions.

This can be accomplished by the use of an optical cavity tuned to an overtone transition, for example, spanning 2, 3 or more vibrational transitions of the excited state reaction product, and optically enclosing the surface reaction zone. The excited state products are typically hydroxyl, a water molecule, a Carbon Monoxide, or carbon dioxide specie.

Another way to accomplish this is to use sequential laser stimulation pulses of different frequencies to control and sequence the transitions of the inverted product specie. The radiation is amplified each time it passes through the inverted medium. Such a sequence of input radiation sequentially depopulates selected inverted levels of the multi-level vibrational energy levels of the inverted products.

The state of the art of making laser cavities permits geometries that are favorable to having reactants and chambers within optical resonance region. One way to do this is to form a laser cavity from a photonic band gap cylinder cavity, wherein the cavity is formed by confinement of light within a hollow core (a large air hole) in a silica-air photonic crystal fiber.

In one embodiment of the present invention, the use of overtone transitions magnifies the frequency or energy difference between upper level transitions and lower level transitions and hence allows this invention to select such transitions and to sequence their stimulation and emission. That is, the stimulated emission may be stimulated first between the highest levels, then between medium levels and on down to lower levels, in sequence. The anharmonic nature of the potential well associated with the multi-level transitions of the chemical reaction products causes energy level spacing of upper level transitions to become closer compared to lower level transitions as the energy level approaches the top of the potential well, which permits differentiation and selection of desired transitions.

In one embodiment, use of the strong electric fields found at the catalyst surface breaks the symmetry, induces molecular polarization and causes otherwise forbidden molecular transitions such as multiple overtone transitions of adsorbed, vibrationally excited products, to exhibit strong dipole transition matrix elements. This in turn permits multi-quantum transitions and renders these transitions to be active candidates for stimulated emission.

The present invention also provides a way to insert the reacting species on to the surface so that the infrared absorptions of the reactants absorb the least possible fraction of the desired emissions, resulting in a net increase in the efficiency of the system.

In one embodiment, the fuel species, known for broadband long wavelength infra red absorbtions, may be inserted from a porous substrate, from within tubes, and/or from channels that reflect IR radiation at the laser frequencies, and where such tubes may have micro-meter or nano-meter holes drilled into them to permit fluid flow, and where such tubes or channels may have catalyst clusters or layers placed on their surfaces. One such a system is a wicking fuel delivery system. This system would include a fuel bed, which can be a wetted material such as metal wool or fibers wetted by fuel or a channel of fuel, and a porous substrate whose surface includes catalyst or catalyst clusters. The porous substrate is in contact with the wicking system. The substrate may be a zeolite, an aerogell, or an aerogell or other suitable substrate permeated with holes such as may be drilled with a laser.

In one embodiment, the use of overtone radiation may place the predominant frequency of the cavity out of range and significantly above the spectral regions associated with intense IR absorption.

The present invention is also directed to causing adsorbed molecular species in excited states to extend the vibrational lifetimes of the product specie so that the vibration energy is minimally dissipated into the lattice during the energy extraction process.

In one embodiment, the substrate upon which the catalyst clusters reside may be a non-conductor, wherein using the non-conductor has been shown to increase the lifetime of certain vibrating specie by orders of magnitude over that of the same species on a conducting substrate.

In one embodiment, the substrate may be chosen so that the vibration frequencies of the substrate mismatch those of the catalyst. This isolates and decouples the superlattice vibrations from the substrate vibrations. This increases the lifetime of a product in an excited state on that surface. Such material may include, for example, chemical vapor deposited diamond, with very high relative phonon frequencies, or in another example lead, with very low phonon frequencies.

The present invention is also directed to causing reaction avalanches, which in turn may be used to cause high peak power pulses of coherent radiation. In one embodiment of the present invention, specie such as the peroxo precursor adsorbed oxygen molecules are stimulated to dissociate upon electrical command using hot electrons generated by a solid state forward biased diode. In such a diode, the catalyst is the metal electrode and diode element of a metal-semiconductor, Schottky diode. When the metal element has a thickness less than a few times the energy mean free path of electrons in that diode, those electrons injected into the metal due to a forward bias are formed as hot electrons with energy at least the same order of magnitude as the sum of the forward bias and the Schottky barrier height.

These intermediate peroxo species have an activation barrier against dissociation of order 0.3 electron volts. Typical dissociative adsorption activation barriers for such trapping mediated adsorbates are of order 0.1 to 0.6 electron volts. The typical Schottky barrier of a diode formed between the metals platinum, palladium, tungsten, copper, silver and gold and a semiconductor such as silicon are typically of order 0.5 volts. A forward bias of 0.5 volts would flood the surface of the catalyst and its adsorbates with 1 eV hot electrons.

In one embodiment of the present invention, limiting the stimulation electron energy not only causes a triggering of the transition of the adsorbate precursor states to dissociation but also biases the triggering so the transition does not go backwards, towards desorption. If the adsorbate does go backwards, limiting the stimulation electron energy increases the fraction that go the desired direction. The appropriate value for the stimulation energy is a value less than the energy of the dissociation barrier. A good choice of energy is also above that of the barrier to the state just before dissociation. For example, for peroxo state oxygen on platinum, the barriers have a difference of order 0.2 eV. The ideal hot electrons produced by our invention would have an energy spread less than this difference, for example of 0.2 eV, and an absolute value within the reactivity range for the adsorbed state, for example, of order 0.1 to 1 eV.

Another method to bias the absorbtions of radiation favoring the dissociation path is to enhance the vibration levels of that specie, such as a peroxo-chemisorbed specie. To do this, the present invention may use an optical cavity to enhance that radiation. For example, peroxo-chemisorbed oxygen on platinum has a 690 per centimeter (infra red optical) resonance. An optical source of such radiation, such as produced by an electrical discharge or by a diode laser, would selectively stimulate this resonance.

Yet another method may provide such optical radiation in a manner that can be sequenced both in frequency and in time. A chirped laser is a method to do this. Some of the radiation that is produced by the method and apparatus of this invention may be tailored to be this desired radiation.

According to the present invention, other specie on the catalyst surface, such as fuel molecules or radicals may be used as hot electron absorbers. As such, they would dissociate into radicals themselves or transfer energy to the peroxo- and superoxo-chemisorbed oxygen precursors, to stimulate the reaction avalanche.

In one embodiment, when control over the timing of reaction initiation is desired, the catalyst may be chosen to have a charged precursor with higher activation barriers against dissociation, a condition which normally makes a catalyst less active.

In one embodiment, the power conversion device of the present invention using hot atoms may include:

substrate(s) such as the catalyst itself, silica, alumina, titania, semiconductor, or convenient materials on which a catalyst, such as platinum nanoclusters, is placed;

a means of flooding the catalyst surface with fuel, such as a porous substrate fed with liquid fuel, a mechanism of bringing air as the oxidizer into the chamber, such as a channel permitting air input and reaction product exhaust to flow over the catalyst surface;

hydrocarbon reactant fuel, such as liquid ethanol, methanol, higher alchohols, or the product of hydrocarbon reformers, such as mixtures containing hydrogen and carbon monoxide;

a poly-chromatic, resonant optical cavity enclosing the catalyst surface reaction region; and a laser system using the optical cavity to extract coherent radiation from the inverted population of reaction products.

According to one embodiment, the hot atoms produce associated reactants born in their highest vibrational states, obviating the need to supply such monatomic specie externally.

In some reactant-oxidizer-catalyst cases the reactants, such as hydroxyl radicals, desorb immediately, which places them in a long-lived state (approximately 200 picoseconds between collisions with other gas molecules, and lifetimes of 10 to 100 collisions) compared to lifetimes on the catalyst metal surface (1 to several picoseconds). The laser system in this case stimulates transitions to remove the vibrational energy. The hydroxyl will not find many other hydroxyls with which to resonantly exchange energy, thereby precluding rapid thermalization via resonant collisional exchange of the molecular vibrational excitations.

In other cases the products, typically vibrationally excited OH or CO, may remain on the catalyst surface, and in this case the lifetime of the vibrations would be of order picoseconds. In this case the catalytic surface electric field causes multiquantum transitions to become more strongly dipole active, and the laser system may now induce transitions on the second, third or 4th overtone, for example of the excited state OH or CO. With turnover numbers of order 10,000 per site per second, typical of good catalysts operating in their desired operating conditions, a 100 layer per centimeter ("cm") reaction chamber would yield 100 watts per cubic centimeter of inverted population. This permits stimulated emission under conditions that would otherwise be too difficult.

Figure 1:
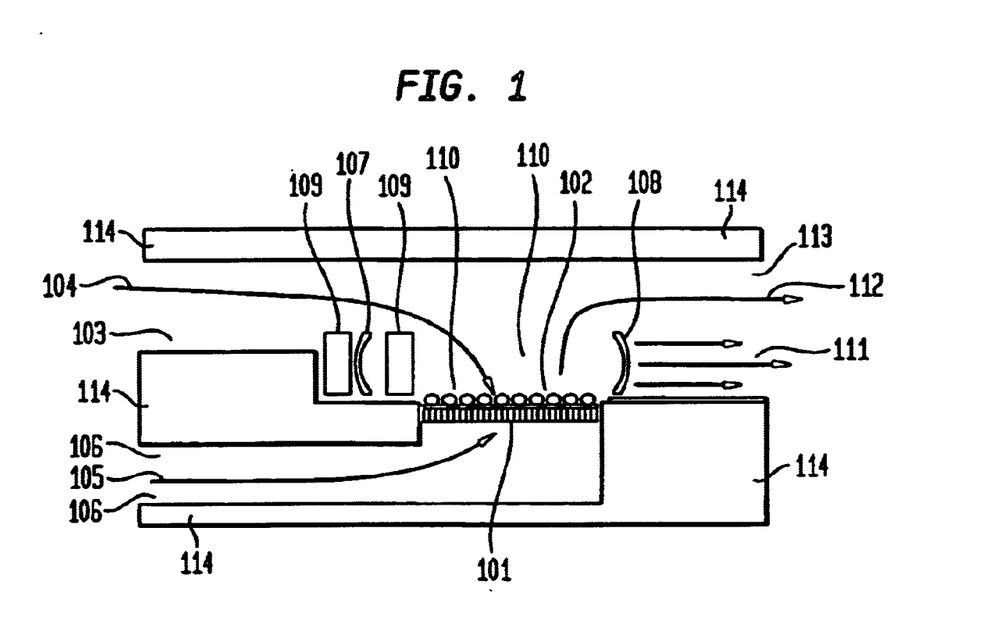
FIG. 1 shows a schematic cross section of an apparatus for energy generation using separated reactants in one embodiment of the present invention.

FIG. 1 schematically shows a cross section of a device to implement some of these concepts. In FIG. 1, a substrate 101 on which a catalyst 102 is affixed, where a gas flow channel 103 guides air 104 over the catalyst 102. The catalyst substrate 101 is porous and permits the flow of fuel 105 from the fuel side of the substrate 101, which liquid or gaseous fuel is guided to the substrate 101 by the fuel channel 106. A polychromatic resonant optical cavity, formed by laser mirror 107 and laser output mirror 108, a laser control system 109, and the greater optical cavity 110, enclose the region of catalytic surface reactions 110 and extract energy in the form of coherent light 111. Exhaust 112 leaves the system and flows through the exit channel 113. Structural materials 114 support these elements and form the fuel, air and exhaust channels.

In another embodiment, the present invention uses stretched molecule associative desorbtion or excited state products desorbing from catalyst surfaces. In this embodiment, a power conversion device may include:

substrate(s) such as the catalyst itself, silica, alumina, titania, a semiconductor or well chosen materials on which a similarly well chosen catalyst is placed;

a mechanism for bringing fuel and air (the oxidizer), into the chamber, such as a channel permitting reactant input and reaction product exhaust to flow over the catalyst surface;

liquid ethanol, methanol, higher alchohols, or the product of hydrocarbon reformers, such as mixtures containing hydrogen and carbon monoxide, as the hydrocarbon reactant fuel;

a poly-chromatic, resonant optical cavity enclosing the catalyst surface reaction region; and a laser system using the optical cavity to extract coherent radiation from the inverted population of reaction products.

According to this embodiment, combinations of reactant and catalyst, which have been chosen to favor production of inverted products, are caused to flow into the reaction chamber containing the catalyst surfaces and where the optically enclosing resonant cavity and its associated laser system extracts a significant fraction of the product reaction energy as radiation. The products are then exhausted and removed from the optically enclosed system, which removes ground state species and maintains the population inversion.

One way to achieve this has the optical cavity enclosing only a region close to the catalyst surface, that is, to use a surface laser, while permitting gas flow out of the surface region. The state of the art of surface lasers, such as disc lasers and single mode photonic band gap systems permits such cylinder symmetry, air hole systems.

Also, catalysts may be chosen according to the method wherein the catalyst exhibits a "pressure gap," as it is referred to in the technical literature. As is the case with CO oxidation on Ruthenium, the oxygen rich adsorption lowers the oxygen heat of adsorption, permitting the desired oxidation and making Ru one of the most active catalysts, whereas the characterizations performed under ultra high vacuum conditions show Ru to be one of the least catalytic.

In this embodiment, one may tailor the properties of the desired catalyst. It has been observed that otherwise catalytically inactive metals, such as gold, are caused to become reactive, and relatively good catalysts, as the number of underlying metal layers is decreased, down to 1 and 2 monolayers, for example.

At 6 or more monolayers, the affinity of gold for dissociation of oxygen has been observed to be negligible. As the number of monolayers decreases to 3 or 2, the affinity is sufficient to dissociate oxygen, but not to bind it too strongly to the gold metal, making the 2 monolayer catalyst efficient. At 1 monolayer the affinity of the gold substrate catalyst for oxygen is so strong that the oxygen becomes unavailable for reaction.

In one method to choose catalysts of the present invention, a method of tailoring and choosing the catalyst favoring a stretched molecule may include:

creating a list of catalyst candidates from the entire set of metals;

choosing the catalyst metals with the interatomic spacing of catalyst atoms such that the reaction product exit channel would form a product with a stretched bond;

forming a catalyst cluster including atomic monolayers in a cluster of nanometers dimension on an oxide substrate;

choosing the number of monolayers to control the affinity for both oxygen and fuel.

For example, choose a gold catalyst of 2 monolayers thickness placed on titania to favor carbon monoxide oxidation.

Figure 2:
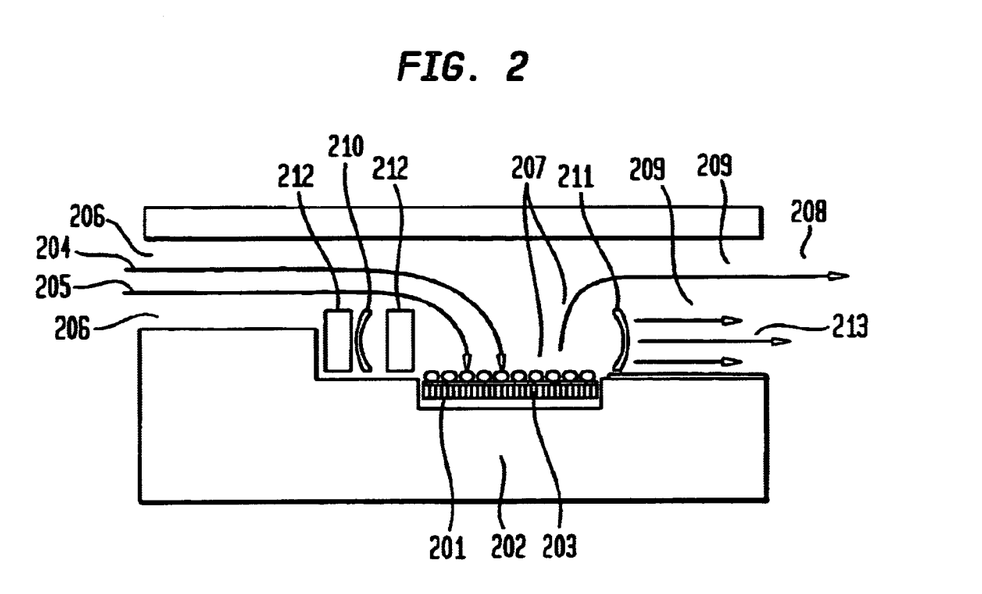
FIG. 2 illustrates a cross section of an apparatus in one embodiment of the present invention for generating energy using free flowing, mixed reactants for forming inverted excited state products.

FIG. 2 shows a cross section of an apparatus to implement some of these concepts. FIG. 2 shows a substrate 201 resting on a support 202 and on which a catalyst 203 is affixed, causes fuel 204 and air 205 entering from the input channel 206 to react, excited state products to be formed and radiate in the reaction channel 207, and causes exhaust 208 to leave via the exhaust channel 209. A polychromatic resonant optical cavity, formed by laser mirror 210 and laser output mirror 211, a laser control system 212, and the greater optical cavity and reaction zone 207, enclose the region of catalytic surface reactions and extract energy in the form of coherent light 213.

In another embodiment, the present invention favoring the stimulation and timing of reaction avalanches may include:

a chamber similar to the one used in the previous embodiment;

a semiconductor substrate and catalyst forming a Schottky diode, with catalyst thickness less than or approximately equal to a few times the energy mean free path of electrons in the metal;

a mechanism providing a pulsed forward bias on the diode.

In one embodiment, a short-pulse light source such as a laser may also be used to provide the hot electrons to energize the trapped adsorbate. For example, such a light source will cause a chemisorbed peroxo-like doubly charged oxygen molecular specie on a platinum catalyst to accelerate its transition over the approximately 0.29 eV barrier, where the molecular specie preferentially moves so as to dissociate. This favors dissociation because the reverse reaction, creation of the super-oxo-like, singly charged molecular oxygen, has a higher activation barrier energy, and the physi-sorbed specie has an even higher activation barrier.

The laser may provide the fastest and shortest pulses. Alternatively a hot electron injector diode may be used.

According to one embodiment, pulsing the diode with 0.5 to 1 volt for short times, such as fractions of a picosecond, raises the energy of a large fraction of the doubly charged molecular oxygen to the level needed to dissociate.

The hot electrons created upon such instantaneous heating of a metal on a thermal insulating substrate may be used in a regenerative feedback mode to further stimulate the peroxo-like specie. In this way, a very small amount of initial stimulator energy may be needed, compared to the energy output of the system.

Figure 3:
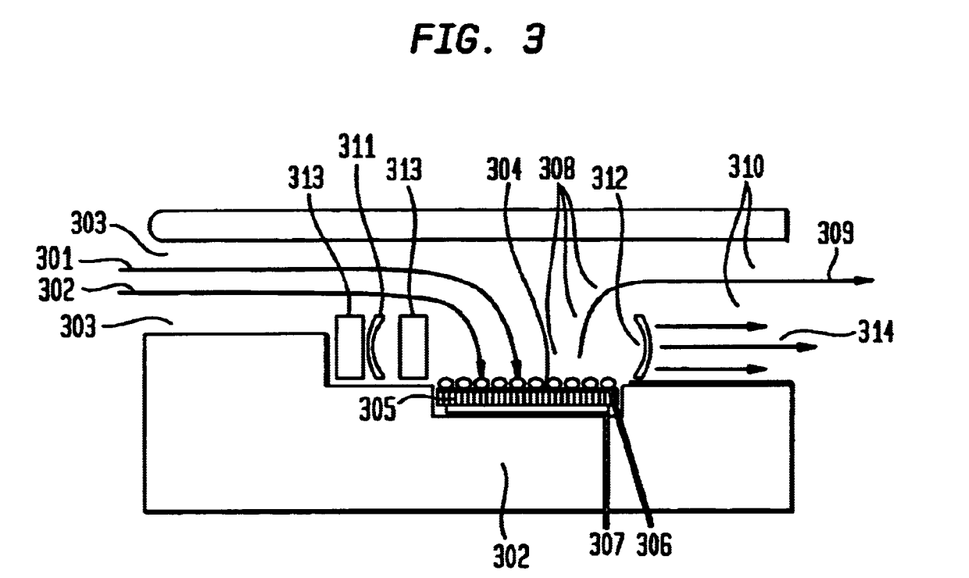
FIG. 3 illustrates a cross section of an apparatus in one embodiment for generating power by externally stimulating and triggering reactions.

FIG. 3 shows a cross section of an apparatus to implement some of these concepts. FIG. 3 shows reactions on the catalyst surface are stimulated to occur in pulses, concentrating the subsequent radiated energy in a small time. A fuel 301 and air 302 mixture enter the reaction zone through the input channel 303 and contact the catalyst surface 304 and physisorb, chemisorb or adsorb. The catalyst 304 and the semiconductor substrate 305 form a Schottky diode. The thickness of the catalyst 304 is of order 1 to 5 nanometers, which is less than the mean free path of electrons in preferred catalysts such as platinum, palladium, tungsten, rhodium, ruthenium, copper, silver or gold.

A short electrical pulse with positive on the catalyst electrode 306 and negative on the semiconductor ohmic contact 307 causes a forward bias and a forward current in the diode formed by the catalyst—semiconductor element. The electrons of this forward current have an excess energy approximately equal to and in excess of the forward bias voltage, and these flood the catalyst surface, initiating a chemical reaction avalanche. The hot electrons cause adsorbed, chemisorbed molecular species trapped in precursor states to surmount their activation barriers and adsorb as atomic specie on the catalyst surface.

The electrical trigger pulse causes the reactants to react all at once and together, causing orders of magnitude increase in the concentration of products, such as excited state specie radiating in the reaction channel 308. Exhaust 309 leaves via the exhaust channel 310.

A laser formed by laser mirror 311 and laser output mirror 312, a laser control system 313, and the greater optical cavity and reaction zone 308, enclose the region of catalytic surface reactions and extract energy in the form of coherent light 314.

While the invention has been particularly shown and described with respect to a preferred embodiment thereof, it will be understood by those skilled in the art that the foregoing and other changes in form and details may be made therein without departing from the spirit and scope of the invention. For example, those skilled in the art will appreciate that the features of the invention may sometimes be used to advantage without a corresponding use of the other features shown or described herein above. Similarly, some features may be combined, within the scope and equivalents of the present invention, to achieve a desired result.

We claim:

1. A method of stimulating emission of radiation, comprising:
   providing a catalyst having a dissociation energy barrier for one or more reactants, the catalyst having a surface with step site formations;
   providing one or more reactants on the catalyst surface to produce hot atoms from the one or more reactants and cause simple vibrationally energetic molecules to be generated from the hot atoms reacting with the one or more reactants;
   providing a frequency chirped time sequenced stimulation radiation near the surface of the catalyst to stimulate emission; and
   enabling cooling of the catalyst to induce condensation and concentration on the catalyst surface.

2. The method of claim 1, wherein the providing one or more reactants includes:
   providing one or more reactant molecules to flood the surface of the catalyst with the one or more reactant molecules.

3. The method of claim 1, wherein the one or more reactant molecules include one or more of oxygen and fuel.

4. The method of claim 1, wherein the catalyst surface is provided with fuel to cause a bias of a dissociative chemisorption process toward creation of hot atom oxygen free radicals, wherein a collision partner of the hot atom is the fuel.

5. The method of claim 1, wherein the reactants comprise at least oxygen and fuel and the catalyst is selected such that oxygen dissociation energy is a fraction of energy resulting from reacting the reactants.

6. The method of claim 5, further including:
   flooding the catalyst surface with oxidizer radicals to cause a bias of a dissociative chemisorption process toward a creation of hot atom fuel free radicals, wherein a collision partner of the hot atom is fuel.

7. The method of claim 1, wherein a hot atom-containing molecule is fuel.

8. The method of claim 7, wherein the catalyst is selected from one or a combination of platinum, palladium, iridium, Rhenium, Rhodium.

9. The method of claim 7, wherein the one or more reactant molecules include one or combination of hydrogen, methanol, ethanol, and a product of hydrocarbon reformers.

10. A method of stimulating emission of radiation, comprising:
    providing a catalyst having a dissociation energy barrier for one or more reactants, the catalyst having a surface with step site formations;
    providing one or more reactants on the catalyst surface to produce hot atoms from the one or more reactants and cause simple vibrationally energetic molecules to be generated from the hot atoms reacting with the one or more reactants;
    providing a frequency chirped time sequenced stimulation radiation near the surface of the catalyst to stimulate emission;
    forming a substrate comprising at least a diode in contact with the catalyst, wherein a distance from an adsorbate on the catalyst surface to the diode is less than 3 times energy mean free path associated with hot electron energy decay in a region between the adsorbate and the diode; and
    providing a pulse of electrical energy to charge the diode.

11. The method of claim 10, wherein the catalyst includes platinum, palladium, iridium, Rhenium, or Rhodium, or combination thereof.

12. The method of claim 10, further including:
    stimulating the production of the hot atoms.

13. The method of claim 10, wherein the substrate has a heat conductivity substantially lower than a heat conductivity of the catalyst.

14. The method of claim 13, wherein the substrate includes thin oxide layers to control diode junction barrier heights.

15. The method of claim 14, wherein the oxide layers have a thickness of 100 nanometers or less.

16. The method of claim 12, wherein the stimulating includes stimulating using one of a pulsed light source, a pulsed laser, and pulsed electric field.

17. The method of claim 16, wherein the stimulating is performed for a duration less than 20 nanoseconds.

18. The method of claim 17, wherein the stimulating is performed at a temperature less than 300 Kelvin.

19. The method of claim 10, wherein the pulse of electrical energy includes a pulsed forward bias sufficient to emit hot electrons into the diode.

20. The method of claim 19, wherein the pulsed forward bias is greater than 0.1 electron volts ("eV").

21. The method of claim 10, further including causing the one or more reactants to acquire energy sufficient to surmount the dissociation energy barrier, but not sufficient to surmount a desorption barrier.

22. The method of claim 21, wherein the energy is less than 1 eV.

23. The method of claim 10, wherein the diode includes a two terminal device.

24. The method of claim 23, wherein the diode includes a metal-insulator-metal device.

25. The method of claim 23, wherein the diode includes a metal-semiconductor-metal device.

* * * * *